United States Patent

Ruegg

[15] 3,667,006

[45] May 30, 1972

[54] SEMICONDUCTOR DEVICE HAVING A LATERAL TRANSISTOR

[72] Inventor: Heniz Walter Ruegg, Hausen, Switzerland

[73] Assignee: U.S. Philips Corporation, New York, N.Y.

[22] Filed: Feb. 19, 1970

[21] Appl. No.: 12,547

[52] U.S. Cl. ..........................317/235 R, 148/175, 148/191, 317/235 Y

[51] Int. Cl. ..........................H01l 11/06

[58] Field of Search..................317/235, 22, 22.1, 21.1, 22.2

[56] References Cited

UNITED STATES PATENTS

| | | | |
|---|---|---|---|
| 3,427,513 | 2/1969 | Hilbiber | 317/235 |
| 3,434,021 | 3/1969 | Hofstein | 317/235 |
| 3,445,734 | 5/1969 | Pecoraro et al. | 317/235 |
| 3,502,951 | 3/1970 | Hunts | 317/235 |
| 3,524,113 | 8/1970 | Augusta et al. | 317/235 |

*Primary Examiner*—Jerry D. Craig
*Attorney*—Frank R. Trifari

[57] ABSTRACT

The invention relates to a semiconductor device having a substrate of the one conductivity type on which an epitaxial layer divided into islands of the opposite conductivity type is provided and in which at least one island comprises a lateral transistor and a buried layer of the opposite conductivity type. In order to obtain both a small vertical emitter injection and a high collector-base breakdown voltage, the emitter zone has a larger thickness than the collector zone and, in contrast with the collector zone, the emitter zone reaches up to the buried layer. No additional manufacturing step is necessary for the manufacture.

5 Claims, 7 Drawing Figures

Patented May 30, 1972 3,667,006

3 Sheets-Sheet 1

*INVENTOR.*

HEINZ W. RÜEGG

BY

AGENT

*INVENTOR.*

HEINZ W. RÜEGG

BY

Frank R. Trifari

AGENT

Figure 1:
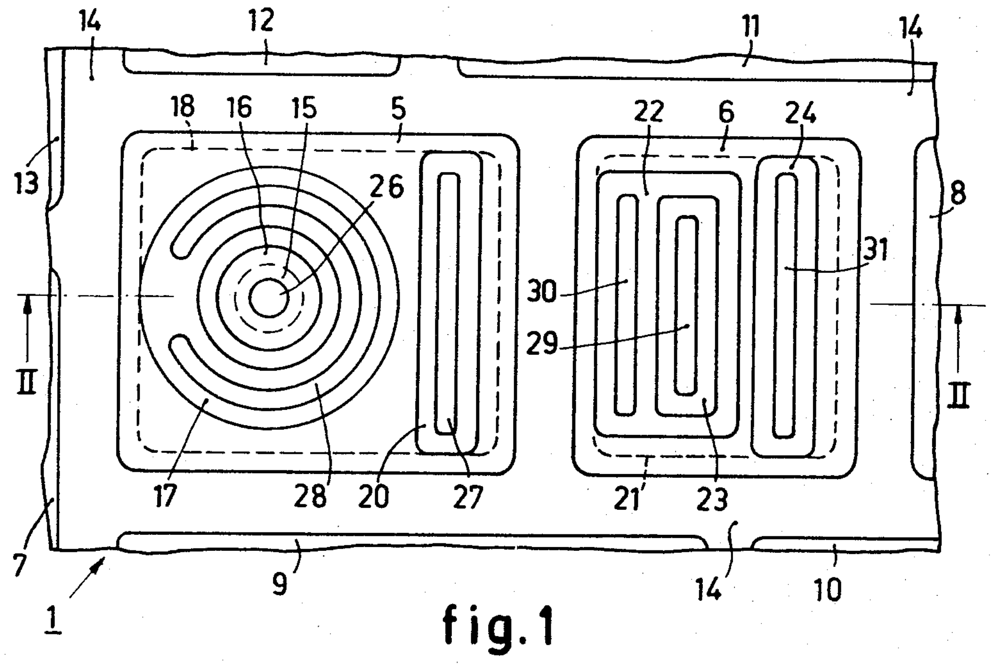

*INVENTOR.*
HEINZ W. RÜEGG
BY
Frank R. Trifari
AGENT

SEMICONDUCTOR DEVICE HAVING A LATERAL TRANSISTOR

The invention relates to a semiconductor device comprising a semiconductor substrate of the one conductivity type, on one surface of which an epitaxial semiconductor layer of the opposite conductivity type is provided, said layer being divided into a number of parts, termed islands, of the opposite conductivity type by separation or isolation zones of the one conductivity type which extend throughout the thickness of the epitaxial layer, a lateral transistor of which the emitter and collector zones are situated beside each other and comprise surface zones of the one conductivity type being provided at least in one island, a buried layer of the opposite conductivity type being situated in the proximity of the junction between the one island and the substrate. Such a semiconductor device is described in the article by D.F. Hilbiber in "I.E.E.E. Transactions on Electron Devices," ED 14, nr. 17. July, 1967, pp. 381–385.

Lateral transistors are of importance for integrated semiconductor circuits and provide the possibility of incorporating in the said circuits p-n-p and n-p-n transistors, respectively, in addition to conventional vertical n-p-n or p-n-p transistors. Buried layers can be obtained by diffusion of an impurity in the substrate prior to providing the epitaxial layer. The said buried layer has the same conductivity type as the islands. Such a buried layer has a lower resistivity, that is to say, a higher doping, than the islands and is incorporated in a device to which the present invention relates for reducing the base resistance and for reducing the vertical injection of the lateral transistor.

The emitter zone of a lateral transistor injects both charge carriers in lateral directions, that is to say in directions to the collector zone, and in the vertical direction, that is to say in the direction to the buried layer. In order to obtain good electric properties of the lateral transistor it is desirable that the vertical injection should be small.

A small vertical injection can be obtained by constructing the emitter zone as a very small surface zone. However, in that case the emitter zone must be small as a result of which it can no longer be provided by means of the present-day conventional methods of manufacturing integrated semiconductor circuits.

Furthermore it is possible that the emitter and collector zones are surface zones having such a large thickness that they reach up to the buried layer. A device having such emitter and collector zones can be realized in a simple manner and the provision of the lateral transistor requires no extra step in the manufacture. The emitter and collector zones can be provided simultaneously. The vertical injection of the emitter zone is small since the emitter zone reaches up to the highly-doped buried layer. The collector-base breakdown voltage, however, is low since the collector zone also reaches up to the highly-doped buried layer.

In the above-mentioned article it is proposed to provide the buried layer below the emitter zone with a thickening. Although the emitter and collector zones can then be provided simultaneously, in which nevertheless only the emitter zone reaches up the buried layer, an extra photoresist and diffusion treatment is necessary for providing the thickening.

One of the objects of the invention is inter alia to avoid the drawbacks of the above-described devices and to provide a semiconductor device having a lateral transistor in which the vertical injection of the emitter zone is small and the breakdown voltage of the collector zone is large and the manufacture of which requires no extra step.

The invention is inter alia based on the recognition of the fact that, while avoiding an additional step in the manufacturing process of the semiconductor device having a lateral transistor, the emitter zone can be constructed so as to be thicker than the collector zone in such manner that only the emitter zone reaches up to the buried layer.

According to the invention a semiconductor device having a lateral transistor of the type mentioned in the preamble is characterized in that, from the surface of the one island, the emitter zone extends deeper in said island than the collector zone and, in contrast with the collector zone, reaches up to the buried layer. The vertical injection of the emitter zone is small since it reaches up to the buried layer, the base-collector breakdown voltage is large, since the collector zone does not reach up to the buried layer. As will be explained in detail below, the emitter zone can be provided at least partly simultaneously with the separation zones, as a result of which no extra step in the manufacture is required, for providing the emitter and collector zones with different thicknesses.

An important embodiment of a semiconductor device according to the invention is characterized in that the emitter zone consists of two adjoining partial zones of which only the one partial zone adjoins the buried layer and the other partial zone, which is a surface zone having the same thickness as the collector zone, is situated at a shorter distance from the collector zone than the one partial zone. The other partial zone of the emitter zone and the collector zone can be provided simultaneously by means of one diffusion treatment and one associated photoresist method, as a result of which the mutual distance, that is to say the distance between the emitter and collector zones, can be very accurately determined. This would be the case to a lesser extent when the emitter and collector regions can be provided only with different diffusion treatments and photoresist methods.

The one partial zone as well as the other partial zone can be a surface zone.

Furthermore the one partial zone may be a buried layer of the one conductivity type.

The invention furthermore relates to a method of manufacturing a semiconductor device according to the invention which, according to the invention, is characterized in that in a part of a surface of a semiconductor substrate of the one conductivity type an impurity causing the opposite conductivity type is diffused, that an epitaxial semiconductor layer of the opposite conductivity type is provided on the said surface, and that the buried layer of the opposite conductivity type is obtained by diffusion of the said impurity in the epitaxial layer and the substrate, that the separation zones which divide the epitaxial layer in the islands are obtained by local diffusion of an impurity causing the one conductivity type in the epitaxial layer, the buried layer being situated in the proximity of the junction between one of the islands and the substrate, at least a partial zone of the emitter zone of the lateral transistor adjoining the buried layer being provided simultaneously with the provision of the separation zones by local diffusion of an impurity causing the one conductivity type in the one island, the collector zone of the lateral transistor in the form of a diffused surface zone being provided in said island.

A preferred embodiment of a method according to the invention is characterized in that the separation zones and at least a partial zone of the emitter zone adjoining the buried layer are obtained simultaneously by local diffusion of an impurity causing the one conductivity type from the surface of the epitaxial layer.

Another preferred embodiment of a method according to the invention is characterized in that at least the parts of the separation zones adjoining the substrate and at least a partial zone of the emitter zone adjoining the buried layer are obtained by local diffusion of an impurity causing the one conductivity type from the substrate in the epitaxial layer, for which purpose said impurity is provided in the substrate by local diffusion prior to the provision of the epitaxial layer, and in which said impurity has a larger diffusion coefficient and is diffused in the epitaxial layer with a lower concentration than the impurity causing the opposite conductivity type with which the buried layer of the opposite conductivity type is provided. The emitter zone obtains a somewhat more favorable shape than in the preceding preferred embodiment.

A very important preferred embodiment of a method according to the invention is characterized in that an emitter zone consisting of two adjoining partial zones is provided in which only the one partial zone adjoins the buried layer and the other partial zone has the same thickness as the collector zone and is situated at a shorter distance from the collector zone than the one partial zone, the other partial zone and the collector zone being provided simultaneously in the one island in the form of diffused surface zones. As already explained above, the distance between the emitter and collector zones can consequently be determined very accurately.

When the parts of the separation zones adjoining the substrate are provided by diffusion of an impurity from the substrate into the epitaxial layer, the parts of the separation zones adjoining the surface of the epitaxial layer, the other partial zone of the emitter zone and the collector zone are preferably provided simultaneously by local diffusion of an impurity causing the one conductivity type in the surface of the epitaxial layer.

It is to be noted that the emitter zone of the lateral transistor of a semiconductor device according to the invention shows a lower resistance than the emitter zone of a lateral transistor the emitter and collector zones of which consist only of simultaneously obtained diffused surface zones.

Figure 2:
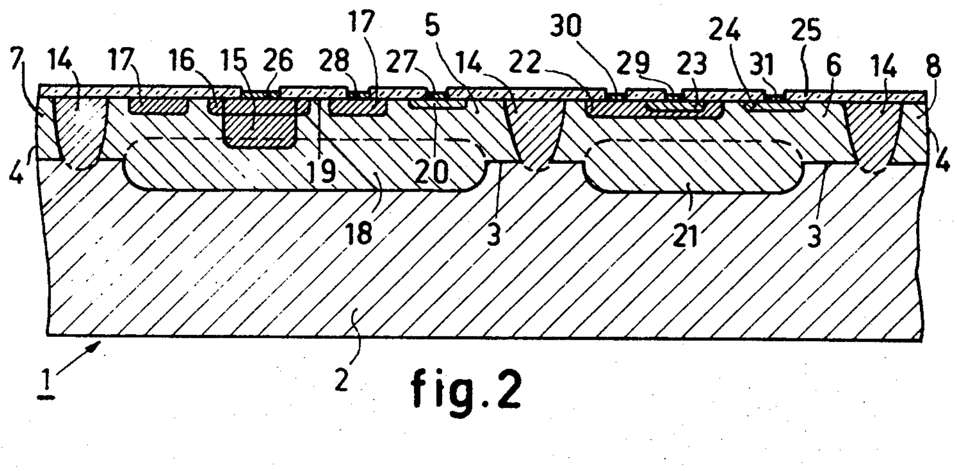
Figure 3:
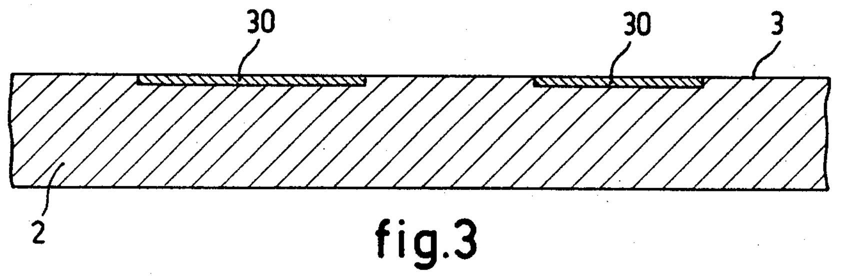
Figure 4:
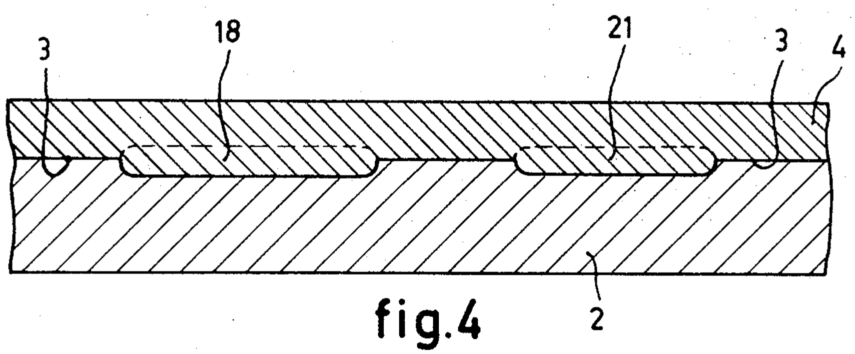
Figure 5:
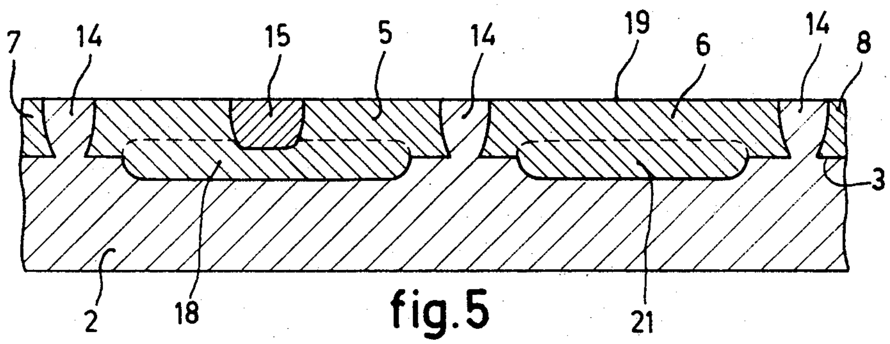
Figure 6:
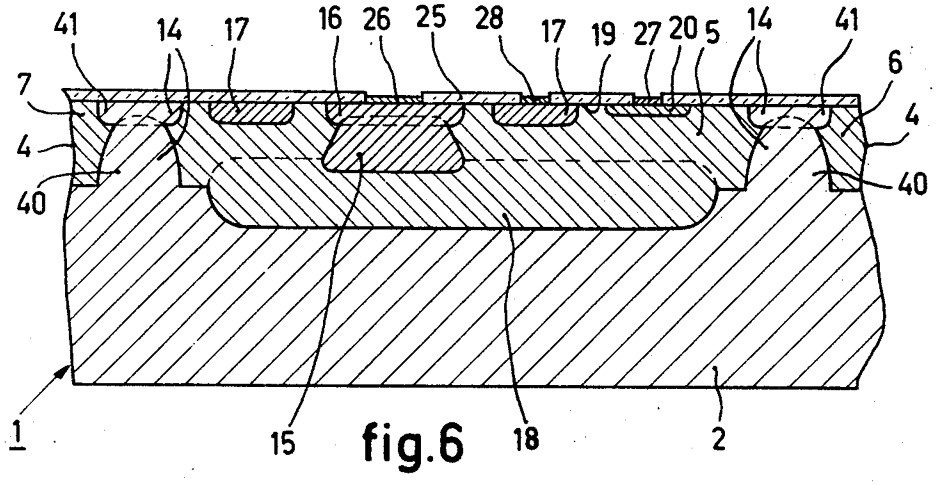

In order that the invention may be readily carried into effect, a few examples thereof will now be described in greater detail with reference to the accompanying drawings, in which FIG. 1 is a diagrammatic plan view of a part of an embodiment of the semiconductor device according to the invention, of which FIG. 2 is a diagrammatic cross-sectional view taken on the line II—II of FIG. 1, FIGS. 3 to 5 are diagrammatic cross-sectional views of the semiconductor body of the semiconductor device shown in FIGS. 1 and 2 in various stages of manufacture thereof, FIG. 6 is a diagrammatic cross-sectional view of a part of an embodiment slightly varied with respect to the embodiment shown in FIGS. 1 to 5.

Figure 7:
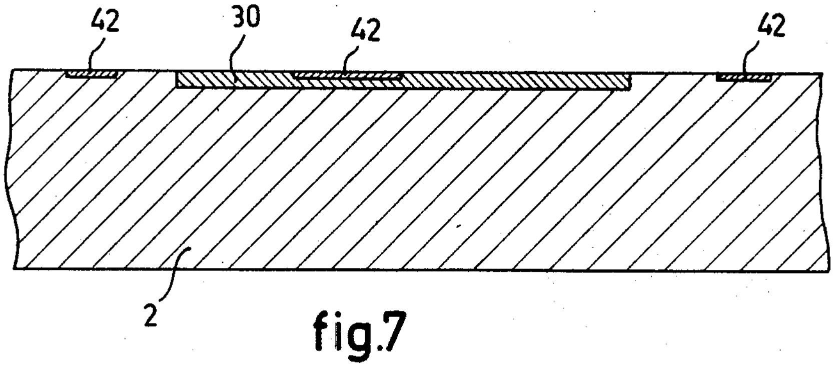

FIG. 7 shows the semiconductor body of the embodiment shown in FIG. 6 in one stage of manufacture thereof.

The embodiment of a semiconductor device according to the invention shown in FIGS. 1 and 2 comprises a semiconductor body 1 having a semiconductor substrate of the one conductivity type, on one surface 3 of which an epitaxial semiconductor layer 4 of the opposite conductivity type is present. The layer 4 is divided into a number of parts 5 to 13, termed islands, of the opposite conductivity type by separation or isolation zones 14 of the one conductivity type which extend throughout the thickness of the epitaxial layer 4. The island 5 comprises a lateral transistor the emitter zone 15, 16, of which and the collector zone 17 of which are situated beside each other and comprise zones of the one conductivity type. A buried layer 18 of the opposite conductivity type is situated in the proximity of the junction between the island 5 and the substrate 2.

According to the invention the emitter zone 15, 16 extends from the surface 19 of the island 5 deeper in said island than the collector zone 17 and, in contrast with the collector zone 17, reaches up to the buried layer 18.

The base zone of the lateral transistor is formed by the island 5 and the buried layer 18. A base contact zone in the form of a low-ohmic surface zone 20 of the opposite conductivity type is provided in the island 5.

The vertical injection of the emitter zone 15, 16 is small since said zone reaches up to the buried layer 18 which is more highly doped than the island 5. The collector-base breakdown voltage is high since the collector zone does not reach up to the buried layer 18.

No additional manufacturing step is required for providing the emitter zone 15, 16 reaching up to the buried layer 18. The partial zone 15 of the emitter zone 15, 16 can be provided simultaneously with and in the same manner as the separation zones 14, and the partial zone 16 can be provided simultaneously with and in the same manner as the collector zone 17.

The emitter zone can consist of the partial zone 15. Since the partial zone 15 is thicker than the collector zone 17, said zones cannot be provided simultaneously in the same manner. As a result of this a very accurate determination of the distance between the emitter and collector zones is hampered during the manufacture. The emitter zone therefore preferably consists of two partial zones 15 and 16 adjoining one another, of which only the partial zone 15 adjoins the buried layer 18 and in which the partial zone 16, which is a surface zone with the same thickness as the collector zone 17, is situated at a shorter distance from the collector zone than the partial zone 15. The distance between the emitter and collector zones is then the distance between the zones 16 and 17 which can be provided simultaneously and in the same manner. The partial zone 16 preferably overlaps the partial zone 15, as little as possible.

In the present embodiment both the one partial zone 15 and the other partial zone 16 are surface zones.

FIGS. 1 and 2 furthermore show an island 6 in which a conventional vertical transistor is provided. The collector region of said transistor is formed by the island 6 and the buried layer 21 of the opposite conductivity type, the base zone is formed by the surface zone 22 of the one conductivity type provided in the island 6, and the emitter zone is formed by the surface zone 23 of the opposite conductivity type provided in the base zone 22. Furthermore, a collector contact zone 24 of the opposite conductivity type is provided in the island 6.

The epitaxial layer 4 is covered in a conventional manner with an insulating layer 25 provided with apertures in which the contact layers 26 to 31 are provided.

The semiconductor device shown in FIGS. 1 and 2 can be manufactured as follows:

In a part of a surface 3 of a p-type silicon substrate 2 (FIG. 3) having a thickness of approximately 120$\mu$ and a resistivity of approximately 5 ohm.cm, an impurity causing n- type conductivity, for example, arsenic or antimony, is diffused in a conventional manner, the thin surface zones 30 containing arsenic being obtained. An n-type epitaxial silicon layer 4 (FIG. 4), thickness approximately 10$\mu$, resistivity from 1 to 5 ohm.cm, is provided on the surface 19 in a conventional manner. By diffusion of the arsenic in the epitaxial layer 4 and in the substrate 2 the buried $n^+$ layers 18 and 21 are obtained. By local diffusion of an impurity causing p-type conductivity, for example, boron, in the epitaxial layer 4, the p-type separation zones 14 (FIG. 5) are obtained. These separation zones 14 divide the epitaxial layer into n-type islands in which the $n^+$ buried layer 18 is situated in the proximity of the junction between the island 5 and the substrate 2 and the $n^+$ buried layer 21 is situated in the of the junction between the island 5 and the substrate 2. Simultaneously with the provision of the separation zones 14, the partial zone 15 of the emitter zone of the lateral transistor adjoining the buried layer 18 is provided in the island 5.

The diffusion of boron to obtain the separation zones 14 and the partial zones 15 can take place in any conventional manner from the surface 19 of the epitaxial layer 4 by means of any conventional diffusion mask provided on the surface 9 and consisting, for example, of silicon oxide or silicon nitride. For reasons of simplicity the diffusion mask is not shown in FIG. 4.

By diffusion of, for example, boron, the p-type collector zone 18 (FIGS. 1 and 2) and the p-type partial zone 16 in the form of diffused surface zones are then provided simultaneously in any conventional manner.

The p-type base zone 22 of the vertical transistor can be provided simultaneously with the zones 16 and 17.

The $n^+$ contact zones 20 and 24 and the $n^+$ emitter zone 23 of the vertical transistor are provided in any conventional manner by diffusion of, for example, phosphorus.

The epitaxial layer 4 is covered in a conventional manner with an insulating layer 25 which consists, for example, of silicon oxide or silicon nitride which layer is provided with apertures in which the contact layers 26 to 31 which consist, for example, of aluminum are provided.

Electric connections to the aluminum layers 26 to 31 can be made in any conventional manner.

The buried layers 18 and 21 have a thickness of approximately 7$\mu$, zones 16, 17 and 22 of approximately 3$\mu$ and the zones 20, 23 and 24 of approximately 2$\mu$.

In the plan view of FIG. 1 the zone 15 has a diameter of approximately 30$\mu$ and the zone 16 has a diameter of approximately 32 to 34$\mu$. The distance between the zones 16 and 17 is approximately 4$\mu$, the width of the annular collector zone is approximately 20$\mu$ and the shortest distance between the zones 17 and 20 is approximately 10$\mu$. The zones of the vertical transistor have dimensions commonly used for such a transistor.

The device described comprises a p-n-p lateral transistor and an n-p-n vertical transistor. The emitter series resistance is small as a result of the two partial zones 15 and 16.

FIG. 6 shows a part of a semiconductor device according to the invention having a lateral transistor which is slightly varied with respect to that of the preceding embodiment.

The emitter zone consists of two adjoining partial zones 15 and 16 as in the preceding embodiment. The partial zone 15 which adjoins the buried layer 18, however, is not a surface zone but a buried layer. The form of the emitter zone 15, 16 consequently is slightly more favorable than in the preceding embodiment.

During the manufacture the parts 40 of the separation zones 14 adjoining the substrate 2 and the partial zone 15 of the emitter zone 15, 16 adjoining the buried layer 18 are obtained by local diffusion of an impurity causing p-type conductivity, from the substrate 2 in the epitaxial layer 4. This impurity is provided in the surface zones 42 (FIG. 7) prior to the provision of the epitaxial layer 4 by local diffusion in the substrate 2. The impurity must have a larger diffusion coefficient than the impurity arsenic in the surface layer 30, with which the buried layer 18 is formed. Furthermore, said impurity must be diffused in a smaller concentration in the epitaxial layer than the arsenic. The impurity may consist, for example, of boron.

After providing the epitaxial layer, the parts 41 of the separation zones 14 adjoining the surface 19 of the epitaxial layer 4, the partial zone 16 of the emitter zone 15, 16, and the collector zone 17 are provided simultaneously by local diffusion of an impurity causing p-type conductivity, for example, boron, in the surface 19 of the epitaxial layer 4.

The manufacture is furthermore carried out as described in the preceding embodiment. The dimensions and materials may be the same as those of the preceding embodiment.

It will be obvious that the invention is not restricted to the examples described and that many variations are possible to those skilled in the art without departing from the scope of this invention. The semiconductor body may consist of semiconductor materials other than silicon, for example, germanium, or a III–V compound. The conductivity types may be interchanged, so that a semiconductor device according to the invention may comprise an n-p-n lateral transistor. The design may be different from that shown in the Figures. In the plan view shown in FIG. 1, the zones 15, 16 and 17 may be, for example, rectangular and the zone 20 may surround the zone 17. A semiconductor device may comprise more semiconductor circuit elements than is shown. In addition to a lateral transistor, for example, vertical transistors, field effect transistors diodes, capacities and resistors may be present. The circuit elements may be interconnected electrically by means of conductive tracks on the insulating layer.

What is claimed is:

1. A semiconductor device comprising a semiconductor substrate of one type conductivity, an epitaxial layer of the opposite type conductivity on a surface of the substrate, vertical zones of the one type conductivity extending through the epitaxial layer to form islands of the opposite type conductivity, a buried layer being located approximately at the epitaxial layer-substrate interface of one of the islands, said buried layer having a higher conductivity than that of the island, a lateral bipolar transistor within said one island, said lateral transistor comprising a surface emitter zone of one type conductivity, an adjacent surface collector zone of one type conductivity and spaced from the buried layer, the intervening island material constituting the transistor base zone of opposite type conductivity, said emitter zone comprising a first portion of one type conductivity extending vertically from the buried layer toward the epitaxial layer surface, said emitter zone further comprising a second portion of one type conductivity extending vertically from the epitaxial layer surface to a depth equal to that of the collector zone, said second emitter portion being coextensive with part of the first emitter portion and being spaced closer to the collector zone than the emitter first portion, means for biasing the emitter zone in the forward direction to inject carriers into the base zone and means for biasing the collector zone in the reverse direction to collect the injected carriers, whereby the major carrier injection from the emitter zone occurs from the second portion located closer to the collector and in one type conductivity material of lower conductivity.

2. A semiconductor device as set forth in claim 1 wherein the first emitter portion extends vertically to the surface of the epitaxial layer, and the buried layer is of the opposite type conductivity.

3. A semiconductor device as set forth in claim 1 wherein the first emitter portion stops short of the surface of the epitaxial layer.

4. A semiconductor device as set forth in claim 1 wherein the collector zone and the second emitter portion have substantially the same dopant concentration and distribution.

5. A semiconductor device as set forth in claim 4 wherein the first emitter portion has a dopant concentration and distribution corresponding at least in part to that of the said vertical zones.

* * * * *